United States Patent [19]

Buckinx et al.

[11] Patent Number: 4,470,026
[45] Date of Patent: Sep. 4, 1984

[54] ACOUSTICAL WAX ON A SURFACE WAVE DEVICE

[75] Inventors: Pol Buckinx, Diepenbeek; Mieke Jacobs, Heverlee, both of Belgium

[73] Assignee: GTE Products Corporation, Stamford, Conn.

[21] Appl. No.: 344,456

[22] Filed: Feb. 1, 1982

[30] Foreign Application Priority Data

Dec. 14, 1981 [BE] Belgium .......................... 01658

[51] Int. Cl.³ .................. H03H 9/145; H03H 9/64
[52] U.S. Cl. ................................ 333/194; 333/150; 333/153; 333/196
[58] Field of Search ................................ 333/150–155, 333/193–196; 310/313 R, 313 A, 313 B, 313 C, 313 D; 331/107 A; 29/25.35

[56] References Cited

U.S. PATENT DOCUMENTS

| 4,146,851 | 3/1979 | Dempsey et al. ................ 333/194 |
| 4,234,859 | 11/1980 | Ikushima et al. ................ 333/194 |
| 4,243,960 | 1/1981 | White et al. .................... 310/313 R |
| 4,247,835 | 1/1981 | Lewis ............................ 310/313 |
| 4,350,963 | 9/1982 | Iwamoto et al. ................ 333/151 |

*Primary Examiner*—Marvin L. Nussbaum
*Attorney, Agent, or Firm*—John A. Odozynski

[57] ABSTRACT

A surface acoustic wave (SAW) filter partially coated with an acoustical wax, such as one soluble in trichlorethylene, or with an epoxy paint dramatically improves the performance of the filter, especially with regard to the attenuation of out-of-band signals.

The coating pattern may be initially empirically determined depending on the substrate and transducer configuration but once determined is readily amenable to known printing and stamping techniques.

6 Claims, 1 Drawing Figure

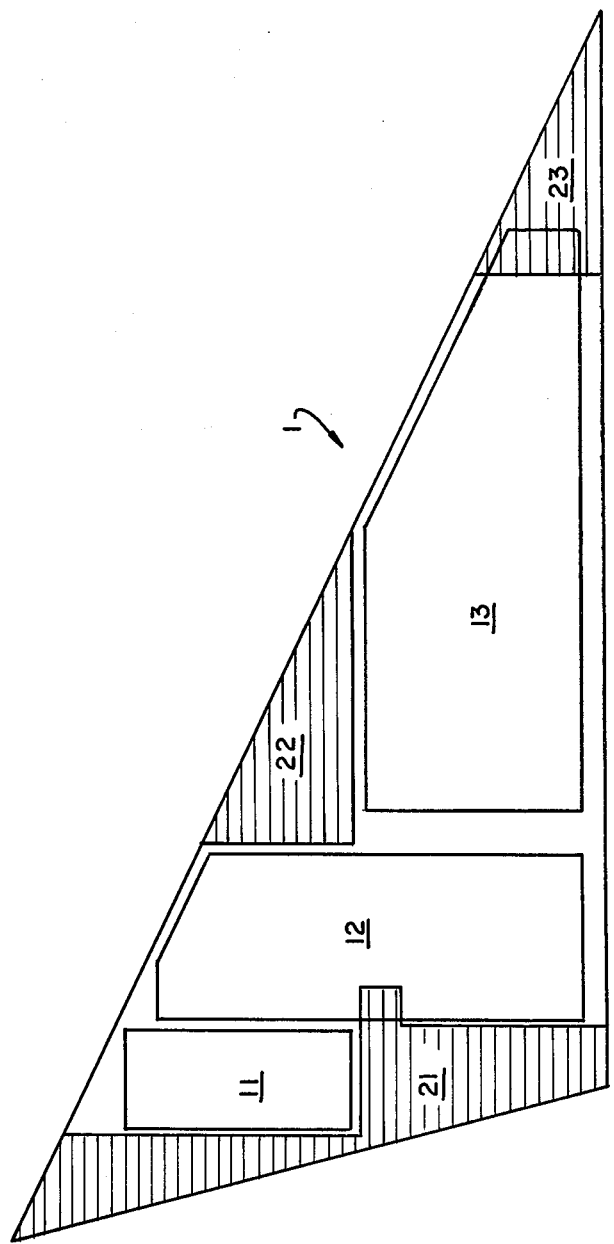

ACOUSTICAL WAX ON A SURFACE WAVE DEVICE

TECHNICAL FIELD

This invention relates to surface acoustic wave (SAW) devices and more particularly to an improved SAW filter including an acoustical wax deposited upon at least a portion of the filter substrate and the filter transducers.

BACKGROUND ART

Surface acoustic wave devices, comprising a piezoelectric substrate upon which are deposited various configurations of conductive transducers, have found widespread utility in the processing of electronic signals. For example, many television receivers employ such devices as a filter in the intermediate frequency (IF) section of the receiver. Among the advantages offered by SAW filters are relative reduction in the volume of circuitry required to provide a given degree of filtering and improved immunity to spurious electrical noise.

An example of a SAW filter is described in U.S. Pat. No. 4,146,851: "Acoustic Wave Device," assigned to the assignee of the subject invention and hereby incorporated by reference. The filter described therein includes a substantially rectangular substrate that may be constructed from for example, lithium niobate. At a lower corner of one end of the substrate is deposited an input transducer in the form of a series of interdigitated conductive elements. At the upper corner of the opposite end of the substrate is deposited a similary arranged output transducer, also in the form of a series of interdigitated conductive elements. Included as well are a (3db) multistrip coupler and a reflector. The coupler causes signals launched by the transducer to be directed in quadrature (90 degree phase relationship) to both the output transducer and the reflector. The phase relationship between the signals directed to the output transducer and to the reflector result in substantial cancellation of "triple-transit" signals, as thoroughly described in the patent cited supra. A triple-transit signal (or, alternatively, back reflection) can generally be described as an attenuated and time-delayed version of the signal originally launched by the input transducer and intercepted by the output transducer. It is the result of a mechanism whereby signals intercepted by the output transducer are in part reflected back to the input transducer along the filter substrate and subsequently re-transmitted back to the output transducer. The triple-transit signal is therefore delayed by a time approximately equal to twice the time required for propogation from the input to output transducer.

The reduction of triple-transit signals is a highly desirable effect because the triple-transit signals result in ripple and other anomalies in the phase and frequency responses of the filter. Ripple in the passband of an TV receiver filter is most saliently manifest as "ghosts" in the image reproduced on the receiver cathode ray tube.

The above explication is intended to convey only some of the complexities inherent in the fabrication of a SAW filter and to indicate the amount of substrate surface required to implement a filter characterized by the desired passband phase/frequency response and out-of-band signal rejection requirements.

A somewhat differently configured SAW filter is described in U.S. Pat. No. 3,872,410: "Surface Wave Filter for TV IF Stage," also assigned to the assignee of the subject invention and hereby incorporated by reference. One of the salient features of that filter is a piezoelectric substrate that assumes a parallelogram form characterized by an acute angle in the range of 20 to 25 degrees. The parallelogram configuration has been found to reduce back reflections propogated by the piezoelectric material. (See Column 4, lines 44 to 52 of that patent.)

Finally, U.S. patent application Ser. No. US81/00452: "Surface Acoustic Wave Filter" also assigned to the assignee of the subject invention, describes a SAW filter having a triangularly configured substrate. The triangular configuration not only reduces by a factor of about one-half amount of substrate material required but also attenuates the degree of triple-transit signal encountered.

The subject invention is directed to a SAW filter that further improves the filters resistance to triple transit signals and improves the rejection of out-of-band signals.

DISCLOSURE OF THE INVENTION

The invention is a surface wave device that comprises a triangularly configured substrate and a plurality of conductive transducers. A selected moiety of the device, including portions of the substrate as well as one or all of the transducers, is coated with, for example, a trichlorethylene-soluble synthetic acoustical wax or an expoxy paint.

The coating dramatically improves the filter's performance especially with regard to the attenuation of out-of-band signals.

BRIEF DESCRIPTION OF THE DRAWING

The sole drawing is a pictorial representation of a SAW filter as described above, indicating those portions representatively coated with a material that dramatically increases the filter's rejection to spurious signals, improves its inband frequency response characteristics, and enhances its sidelobe rejection.

BEST MODE FOR CARRYING OUT THE INVENTION

For a better understanding of the present invention, together with other further objects, advantages and capabilities thereof, reference is made to the following disclosure and appended claims in connection with the above described drawing.

One of the important characteristics of IF filter, SAW or otherwise, is its sidelobe rejection. Sidelobe rejection may be generally regarded as relative attenuation of signals outside the frequency range of interest. For example, if the desired information-bearing TV signals occupy a frequency range characterized by a center frequency at 37.4 MHZ and a 6 MHZ bandwidth, then, in order to achieve desired picture quality, it is desirable to attenuate, insofar as possible, signals outside that frequency range. Sidelobe rejection can then be regarded as the attenuation of signals outside the 6 MHZ bandwidth relative to the attenuation at 37.4 MHZ.

Furthermore, because of the aggravated, interference resulting from signal energy concentrated at the respective discrete adjacent channel picture carrier and sound carrier frequencies, even greater attenuation is sought at those frequencies. Accordingly, it is common to incorporate "traps" at the corresponding adjacent picture and sound carrier frequencies.

In addition to some of the methods employed as described above, it has become a recognized practice to apply an acoustical wax at the ends of the piezoelectric substrate. That technique has empirically been found to improve both the frequency response of the filter as well as its sidelobe or spurious response rejection. This invention is directed to a method and pattern of coating not only the ends of the substrate but also certain portions of the input and output transducers as well as the multistrip coupler. The precise pattern of the covering has been found to enhance the filter response at certain frequencies and to reject signal energy at other specified frequencies. It is believed that this effect is acheived through the absorption, by the coating, of bulk waves, diffracted waves and reflected waves. It is to be understood that optimal results depend upon the correlation of the coating pattern to the specific transducer configuration. However, once the actual substrate and transducer configuration (i.e. dimensions) have been established, it is a relatively simple and practical matter to experimentally determine a reproducably effective coating pattern.

Initially an empirically determined coating pattern is ascertained by applying the coating with a small brush and monitoring the effect of the coating on the frequency characteristics of the filters. A preferred coating may be a synthetic acoustical wax that is soluble in trichlorethylene. The salient advantages of such a coating lie in the fact that the wax is, one, "erasable" with trichlorethylene and, two, ammenable to relatively rapid drying so that timely ascertation of its resultant effects may be obtained. In addition to trichlorethylene-soluble acoustical waxes, several types of epoxy paints have been found effective to the same end if not in the same degree. Once a substantially optimal pattern has been established according to the methodology detailed above, a more convenient production method may be implemented. For example, the coating may be applied by a commonly known printing machine with normal stamping techniques. According to such a technique, a rubber tampon picks up the coating from a mold etched with a pattern complementing the desired pattern of deposition. The tampon then approaches the substrate, including transducers, and deposits the coating on the substrate. In this manner the frequency response of the filter can be improved in a simple and reliable manner.

The drawing represents a typical triangularly configuration filter with a corresponding coated pattern. That is, the substrate 1 includes transducers 11, 12 and 13, and coated portions 21, 22 and 23.

Accordingly, while there has been shown and described what is at present considered to be the preferred embodiment of the invention, it will be obvious to those skilled in the art that various changes and modifications may be made therein without departing from the scope of the invention as defined by the appended claims. To wit, SAW filters may often be used in applications other than the IF section of TV receivers. In such applications radically different substrate and transducers geometrics may be encountered. However, it is persuasively maintained that the invention described above will remain inherently effective when practiced by one with minimal skill in the art envolved.

INDUSTRIAL APPLICABILITY

The subject invention is useful in the fabrication and optimization of SAW filters in a plethora of applications.

What is claimed:

1. A surface acoustic wave filter comprising:
a generally triangularly-configured piezoelectric substrate,
an electrically conductive input transducer deposited on the substrate,
an electrically conductive output transducer deposited on the substrate,
an electrically conductive third transducer deposited on the substrate and positioned generally intermediate the input and the output transducers, and
an acoustic wax coating covering at least a moiety of the filter, including portions of the substrate, the input transducer, and the third transducer.

2. A surface acoustic wave filter as defined in claim 1 wherein the coating is a synthetic wax soluble in trichlorethylene.

3. In a surface acoustic wave filter including a piezoelectric substrate upon which are deposited an electrically conductive input transducer, and electrically conductive output transducer, and an electrically conductive third transducer, the improvement comprising an acoustic wax coating covering portions of the substrate, the input transducer, the output transducer, and the third transducer, the acoustic wax coating for enhancing the overall frequency response of the filter.

4. An improvement as defined in claim 3 wherein the coating is a synthetic wax soluble in trichlorethylene.

5. A surface acoustic wave filter comprising:
a generally triangularly-configured piezoelectric substrate,
an electrically conductive input transducer deposited on the substrate,
an electrically conductive output transducer deposited on the substrate,
an electrically conductive third transducer deposited on the substrate and positioned generally intermediate the input and the output transducers, and
an epoxy paint coating covering at least a moiety of the filter, including portions of the substrate, the input transducer, and the third transducer.

6. In a surface acoustic wave filter including a piezoelectric substrate upon which are deposited an electrically conductive input transducer, and electrically conductive output transducer, and an electrically conductive third transducer, the improvement comprising an epoxy paint coating covering portions of the substrate, the input transducer, the output transducer, and the third transducer, the epoxy paint coating for enhancing the overall frequency response of the filter.

* * * * *